(12) United States Patent
Ogawa

(10) Patent No.: US 6,686,693 B1
(45) Date of Patent: Feb. 3, 2004

(54) ORGANIC ELECTROLUMINESCENT DEVICE WITH DISJOINTED ELECTRODES ARRANGED IN GROUPS

(75) Inventor: Yukio Ogawa, Mobara (JP)

(73) Assignee: Futaba Denshi Kogyo Kabushiki Kaisha, Chiba (JP)

( * ) Notice: Subject to any disclaimer, the term of this patent is extended or adjusted under 35 U.S.C. 154(b) by 325 days.

(21) Appl. No.: 09/654,430

(22) Filed: Sep. 1, 2000

(30) Foreign Application Priority Data

Sep. 6, 1999 (JP) ............................... 11-251893

(51) Int. Cl.[7] ..................... H05B 33/26; H05B 33/02
(52) U.S. Cl. .................. 313/505; 313/504; 313/506; 313/509; 313/500; 313/503; 428/917
(58) Field of Search ..................... 313/504, 505, 313/506, 509, 500; 428/917; 315/169.3

(56) References Cited

U.S. PATENT DOCUMENTS 5,804,917 A * 9/1998 Takahashi et al. .......... 313/504
5,998,926 A * 12/1999 Tsuruoka et al. ........... 313/506
6,107,736 A * 8/2000 Shi et al. ................... 313/509
6,191,433 B1 * 2/2001 Roitman et al. ............ 257/40
6,373,187 B1 * 4/2002 Nagayama et al. ......... 313/506

FOREIGN PATENT DOCUMENTS

JP            11045781 A  *  2/1999  ........... H05B/33/26

* cited by examiner

*Primary Examiner*—Vip Patel
*Assistant Examiner*—Sikha Roy
(74) *Attorney, Agent, or Firm*—Katten Muchin Zavis Rosenman

(57) ABSTRACT

An organic electroluminescent device comprises an insulating substrate, a first electrode layer, a second electrode layer, and a number of conductive wiring pads formed on the insulating substrate, wherein at least one of the electrode layers is transparent and the second electrode layer includes a plurality of disjointed electrodes, the disjointed electrodes being grouped into a plural number of groups and at least one of the groups having at least two disjointed electrodes, and an organic layer interposed between the first and the second electrode layers. The disjointed electrodes of each group are electrically connected to each other within said each group via one or more selected wiring pads.

14 Claims, 5 Drawing Sheets

ORGANIC ELECTROLUMINESCENT DEVICE WITH DISJOINTED ELECTRODES ARRANGED IN GROUPS

FIELD OF THE INVENTION

The present invention relates to an organic electroluminescent (EL) device and a manufacturing method thereof; and, more particularly, to an organic EL device having a pair of electrodes at least one of which is transparent and a thin film made of an organic compound deposited between the electrodes, and a method for the manufacture thereof.

BACKGROUND OF THE INVENTION

There is shown in FIG. 1 a schematic cross sectional view of a prior art organic electroluminescent (EL) device 31.

As shown, the organic EL device 31 comprises a substrate 32 made of, e.g., glass, an anode layer 34 formed on the substrate 32 and a cathode layer having a plurality of cathodes 35, and a thin-film organic layer 33 formed between the anode layer 34 and the cathode layer and incorporating therein a luminous layer made of an organic compound. The cathode layer includes a plurality of cathodes 35. In such an organic EL device, when a predetermined voltage is applied between the anode layer 34 and the cathode layer, holes from the anode layer 34 and electrons from the cathodes 35 are injected into the organic layer 33, wherein a hole is combined with an electron to generate light. By using the light radiated through the combination process of the holes and the electrons, i.e., one hole combining with one electron, it is possible to display desired images, e.g., alphanumeric characters and/or predetermined display patterns.

In such an organic EL device 31, each of such characters and patterns includes one or more luminous segments. The luminous segments forming the characters and patterns are organized into several groups and the luminous segments in each group are electrically connected to each other by a single cathode.

Referring to FIGS. 2A and 2B, there are shown a schematic cross sectional view setting forth formation of the cathodes 35 and a top view of a deposition mask 41 for use in forming the cathodes 35 of the organic EL device 31.

As shown in FIG. 2B, the deposition mask 41 is provided with a slit set 42 having three slits 42a, 42b, 42c corresponding to three groups of the luminous segments forming the characters and patterns. After depositing the anode layer 34 made of a transparent material, e.g., ITO (indium tin oxide) on the substrate 32 and then forming thereon the organic layer 33 made of an organic compound, the cathodes 35 are formed on the organic layer 33 by aligning the deposition mask 41 thereon and depositing, e.g., by evaporation, a conductive material therethrough, resulting in obtaining the cathodes 35, each having shape identical to the shape of corresponding one of the slits 42a, 42b, 42c of the deposition mask 41.

In such an organic EL device having the cathodes formed by using the mask, each of the cathodes is formed in an elongated slit shape. When forming the elongated slit-shaped cathodes by a mask deposition technique described above, there often occurs an electrical insulation failure due to bending or deformation of the mask.

To be more specific, when the widths of the slits of the mask are narrow, the thickness of the mask plate is required to be small. When the masking area is smaller than the depositing area (opening area of the mask, i.e., the area of the slits), the mask becomes less rigid or pliant. As a result, the mask can be readily deformed and it becomes difficult to handle the mask, thereby lowering the manufacturing efficiency and yield thereof. Further, the organic layer can be damaged by bending of the mask during the alignment of the mask with the substrate having thereon the anode layer and the organic layer deposited in sequence, thereby degrading the quality of display.

SUMMARY OF THE INVENTION

It is, therefore, an object of the present invention to provide an organic electroluminescent device and a manufacturing method thereof, wherein an electrode layer made of patterned electrodes is formed by using a deposition mask without causing an electrical insulation failure between the electrodes and degradation of the display quality. The deposition mask of the invention eliminates or reduces the bending and deformation problems of the prior art deposition mask, to thereby improve the manufacturing efficiency and yield thereof.

In accordance with one aspect of the present invention, there is provided an organic electroluminescent device comprising:

an insulating substrate;

a first electrode layer, a second electrode layer, and a number of conductive wiring pads formed on the insulating substrate, wherein at least one of the electrode layers is transparent and the second electrode layer includes a plurality of disjointed electrodes, the disjointed electrodes being grouped into a plural number of groups and at least one of the groups having at least two disjointed electrodes; and an organic layer interposed between the first and the second electrode layers, wherein the electrodes of each of said at least one of the groups are electrically connected to each other via one or more selected wiring pads.

In accordance with another aspect of the present invention, there is provided a method for manufacturing an organic electroluminescent device comprising the steps of:

forming a first electrode layer on an insulting substrate;

forming wiring pads made of a first conductive material;

forming an organic layer on the first electrode layer; and forming a second electrode layer on the organic layer by depositing a second conductive material through a mask, wherein the second electrode layer includes a plurality of disjointed electrodes and the disjointed electrodes are grouped into a plural number of groups, at least one of the groups having at least two disjointed electrodes, wherein at least one of the electrodes is transparent and said electrodes of each of said at least one of the groups are electrically connected to each other via one or more selected wiring pads.

In accordance with a further aspect of the present invention, there is provided a method for manufacturing an organic electroluminescent device comprising the steps of:

simultaneously forming a first electrode layer and wiring pads made of a first conductive material on a transparent substrate;

forming an insulation layer on the structure obtained by the simultaneously forming step in such a way that a selected portion of the first electrode layer and at least a portion of each wiring pad are exposed;

forming an organic layer on the exposed first electrode layer; and forming a second electrode layer on the organic layer and the exposed portions of the wiring pads by depositing a second conductive material through a mask, wherein the second electrode layer includes at least one group of separated electrodes and the separated electrodes included in each group are electrically connected to each other via exposed portions of selected one or more wiring pads.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 4:
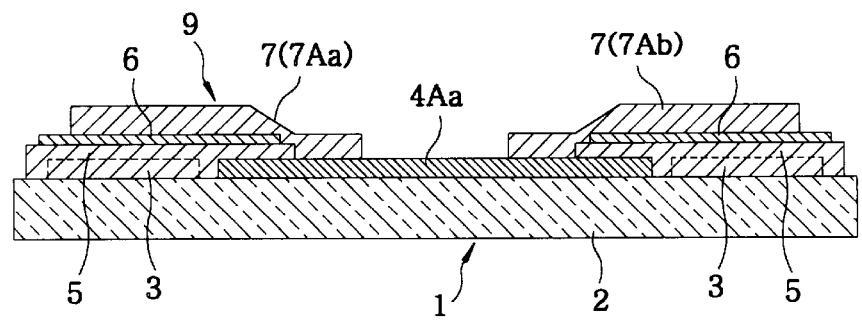
FIG. 4 illustrates an expanded cross sectional view of region "A" in FIGS. 3A to 3D after sequentially depositing the anode layer, the insulation layer, the organic layer and the cathode layer of the organic EL device in accordance with a first preferred embodiment of the present invention.
Figure 5:
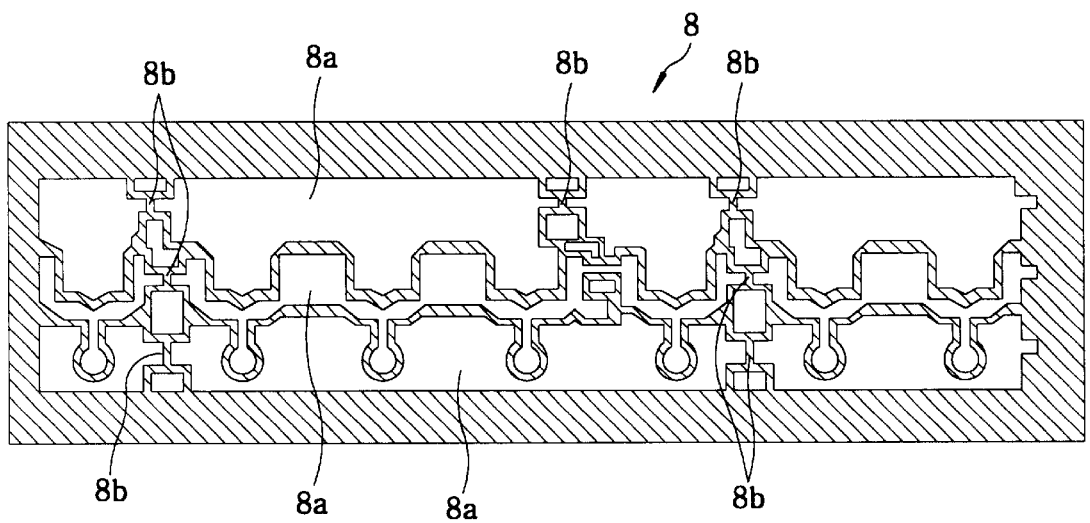
FIG. 5 describes a top view of a mask for forming the cathode layer of FIG. 3D.

Referring to FIGS. 3A to 3D, there are respectively shown exemplary top views of an anode layer 3, an insulation layer 5, an organic layer 6 and a cathode layer 7 incorporated in an organic electroluminescent (EL) device 1 in accordance with the present invention. FIG. 4 shows an expanded cross sectional view of region "A" in FIGS. 3A to 3D, wherein the anode layer 3, the insulation layer 5, the organic layer 6 and the cathode layer 7 of the organic EL device 1 have been deposited; and FIG. 5 illustrates a deposition mask 8 for use in forming the cathode layer 7 shown in FIG. 3D.

Referring to FIG. 4, the organic EL device 1 comprises a substrate 2 made of an insulating transparent material, e.g., glass, as a base. On the substrate 2 is formed the anode layer 3 or a first electrode layer having a thickness ranging, e.g., from several tens of nanometers to several hundreds of nanometers. The anode layer 3 is formed by using, e.g., a resistance heating deposition method, a molecular beam deposition method or a physical vapor deposition method such as sputtering and then is patterned into desired patterns of discrete anodes and anode terminals 3a by using photolithography. The discrete anodes and the anode terminals 3a are connected to each other through wiring lines (not shown).

Figure 1:
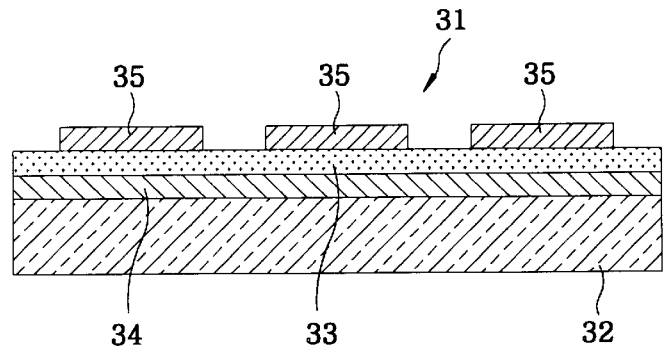
FIG. 1 shows a cross sectional view of a prior art organic electroluminescent (EL) device.
Figure 2A:
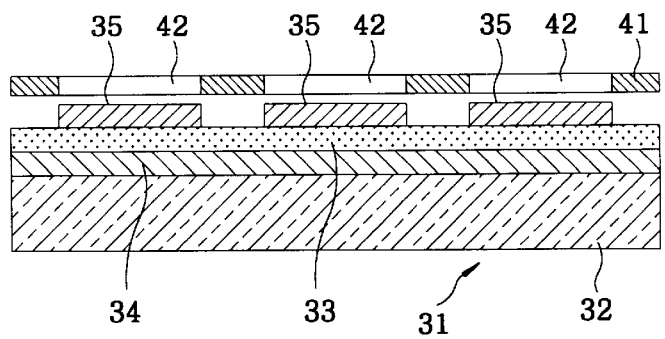
FIGS. 2A and 2B respectively present a cross sectional view setting forth formation of cathodes of the prior art organic EL device and a top view of a deposition mask therefor.
Figure 2B:
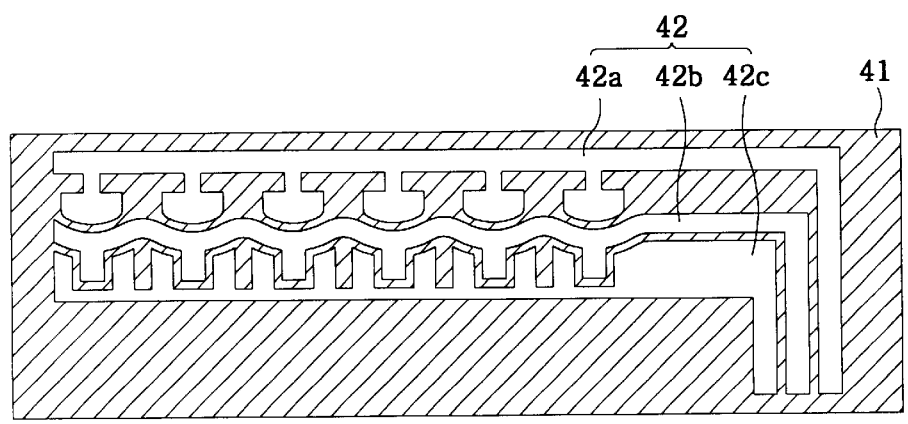
Figure 3A:
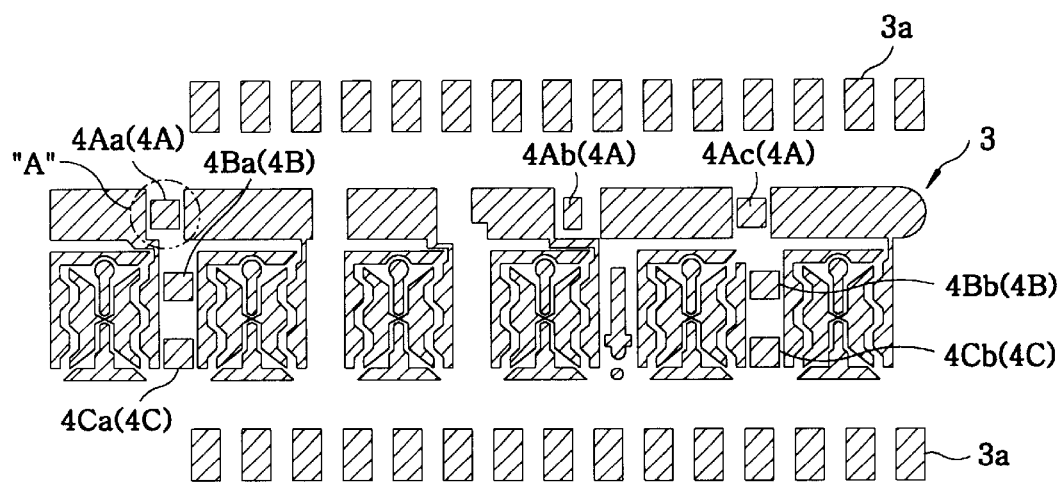
FIGS. 3A to 3D represent top views of an anode layer, an insulation layer, an organic layer and a cathode layer incorporated in an EL device in accordance with the present invention, respectively.
Figure 3D:
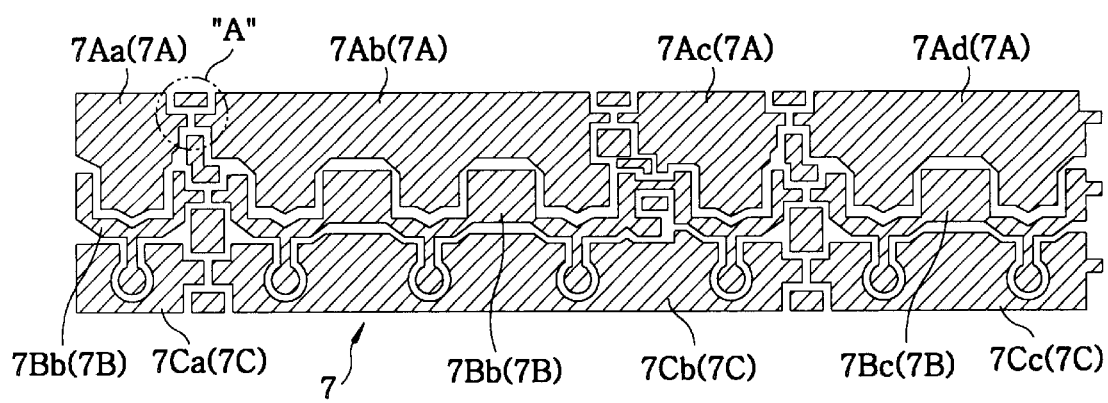

In this embodiment, as shown in FIG. 3A, the anode layer 3 is formed in such a way that its pattern shapes are matched with those of the luminous units or segments of alphanumeric characters and predetermined patterns. Also formed with the anode layer 3, as shown in FIGS. 3A and 4, are wiring pads 4A$a$ to 4A$c$ constituting an upper pad set 4A, 4B$a$ and 4B$b$ constituting a middle pad set 4B, and 4C$a$ and 4C$b$ constituting a lower pad set 4C for respectively connecting cathodes 7A$a$–7A$d$ of an upper cathode 7A, 7B$a$–7B$c$ of a middle cathode group 7B, and 7C$a$–7C$c$ constituting a lower cathode group of the cathode layer 7 (see FIG. 3D) to be formed later.

The pad sets 4A, 4B, 4C are respectively positioned at locations corresponding to places at which the cathodes of each of the groups 7A, 7B, 7C are divided from each other. Specifically, as shown in FIG. 3A, the pads 4A$a$, 4A$b$, 4A$c$ of the upper pad set 4A are respectively positioned at locations corresponding to three places at which four cathodes 7A$a$, 7A$b$, 7A$c$, 7A$d$ of the upper cathode group 7A are disjointed from each other; the pads 4B$a$, 4B$b$ of the middle pad set 4B are respectively positioned at locations corresponding to two places at which three cathodes 7B$a$, 7B$b$, 7B$c$ of the middle cathode group 7B are disconnected from each other; and the pads 4C$a$, 4C$b$ of the lower pad set 4C are respectively positioned at two locations corresponding to two places at which the three cathodes 7C$a$, 7C$b$, 7C$c$ of the lower cathode group 7C are separated from each other.

The anode layer 3 and the wiring pads are made of a conductive material having a larger resistivity than that of a material constituting the cathode layer 7 serving as a second electrode layer. The anode layer 3 and the wiring pads may be formed by using a transparent conductive film, e.g., comprised of ITO or ZnO, or an amorphous transparent conductive film, e.g., comprised of IDIXO (Idemitsu Indium X-Metal Oxide from Idemitsu Kosan Co., Ltd.).

On the other hand, when the wiring pads and the anode layer 3 are formed separately in different processes, the wiring pads may be made of a different material from that of the anode layer 3, e.g., an identical material to that of the cathode layer 7 to be formed later.

Figure 3B:
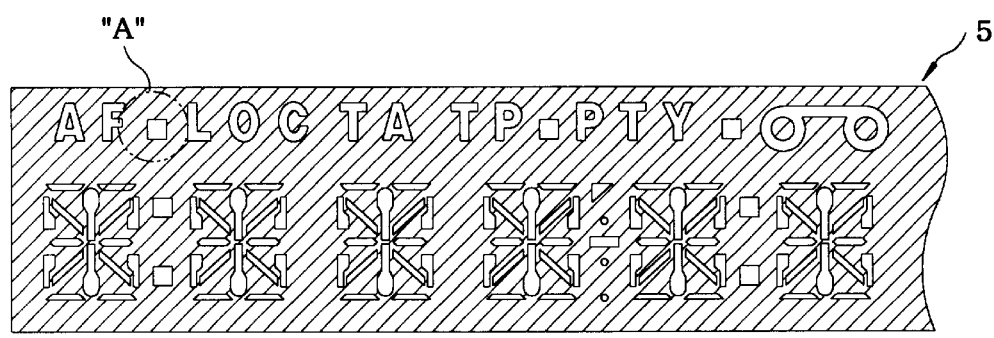

Next, the insulation layer 5 is formed on the substrate 2 on which the anode layer 3 and the wiring pads are also formed. Specifically, as shown in FIGS. 3B and 4, the insulation layer 5 is formed between the anode layer 3 and the organic layer 6 to be formed later so as to cover the whole surface of the anode layer 3 and the wiring pads excepting for the regions corresponding to the luminous segments of the alphanumeric characters and the predetermined patterns and the central portions of the pads 4A$a$–4A$c$, 4B$a$ and 4B$b$, and 4C$a$ and 4C$b$. The insulation layer 5 is made of an organic material, e.g., a negative photosensitive polyimide, or an insulating material capable of being deposited in the form of film, e.g., SiN or $SiO_2$.

When forming the insulation layer 5 by using the negative photosensitive polyimide, the negative photosensitive polyimide of a predetermined thickness is applied first on the anode layer 3 and the wiring pads by using a spin coating or a roll coating method and then an exposure process is carried out by using a mask having a mask pattern capable of generating a patterned polyimide layer exposing portions of the anode layer 3 corresponding to the luminous segments and the central portions of the pads as shown in FIG. 3B. Subsequently, the negative photosensitive polyimide is developed and then subjected to imidization.

Consequently, as shown in FIGS. 3B and 4, there is formed the insulation layer 5 exposing the portions of the anode layer 3 corresponding to the luminous segments of the alphanumeric characters and the predetermined patterns and having through-holes at the locations corresponding to the central portions of the wiring pads.

Figure 3C:
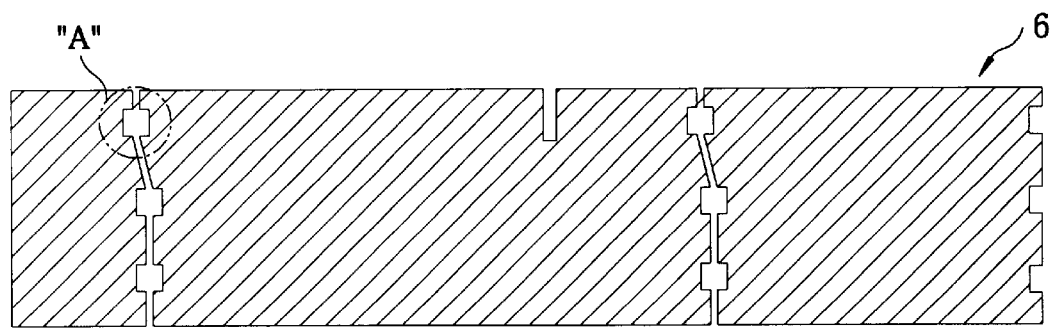

Subsequently, on the insulation layer 5 is formed the organic layer 6 having pattern shapes as shown in FIG. 3C, wherein through-holes in the organic layer 6 are formed at the locations corresponding to the central portions of the wiring pads exposed through the insulation layer 5.

When forming the organic layer 6 by using organic compounds, each compound having a relatively small molecular weight, an organic film made of, e.g., copper phthalocyanine (CuPc) is deposited first on the insulation layer 5 by using the resistive heating evaporation method, wherein the deposited CuPc film serves as a hole injecting layer and has a thickness of, e.g., 70 nm. Subsequently, there is formed on the CuPc film an organic film made of, e.g., β-NPD (N, N'-bis-(1-naphthyl)-N,N'-diphenyl benzidine) serving as a hole transporting layer with a thickness of, e.g., 20 nm. Next, there is formed on the α-NPD film an organic layer made of, e.g., $Alq_3$ (tris(8-quinolinolato) aluminum (III) serving as a luminous and electron transporting layer with a thickness of, e.g., 50 nm.

In case of forming the organic layer 6 by using organic compounds, each compound having a relatively larger molecular weight such as PPV (poly(p-phenylene vinylene)) or derivative thereof, polyfluorene, e.g., poly(9,9'-dihexylfluorene) and/or PVK (poly(9-vinylcarbazole)), it may be possible to employ a spin coating, an applicator coating, or a gravure offset printing technique instead of the deposition method. Further, the organic layer 6 can be configured to have other structures than the three layered structure described above as long as the organic layer 6 functions as a luminous element of the display device.

Next, the cathode layer 7 having predetermined pattern shapes is formed on the organic layer 6 by deposition using, e.g., an evaporation technique. In this embodiment, deposited on the organic layer 6 is the cathode layer 7 having the shapes patterned as shown in FIG. 3D by using the mask 8 shown in FIG. 5.

The cathode layer 7 is divided into a plurality of groups, each group having a number of cathodes separated from each other. For instance, as shown in FIG. 3D, the cathode layer 7 includes three groups, i.e., the upper group 7A, the middle group 7B and the lower group 7C. The groups 7A, 7B, 7C are respectively divided into the cathodes 7Aa–7Ad, 7Ad, 7Bc, 7Ca–7Cc.

As shown in FIG. 5, the deposition mask 8 employed in the present invention includes open slits 8a for depositing the cathode groups 7A, 7B, 7C therethrough. Further, the mask 8 includes bridges 8b as a supporting structure at locations corresponding to places of the wiring pad sets 4A(4Aa–4Ac), 4B(4Ba and 4Bb), 4C(4Ca–4Cb), the bridges 8b functioning to preserve the original shapes of the slits 8a. This arrangement deters the mask 8 from being bent or deformed while aligning the mask 8 with the substrate 2, preventing the electrical insulation failure and the degradation of the display quality.

The cathode layer 7 is preferably made of a conductive material having a smaller resistivity than that of a material constituting the anode layer 3. For instance, the cathode layer 7 may be made of a metal, e.g., Al, Li, Na, Mg, Ca or a compound thereof, or an alloy such as Mg—Ag, Al—Li, Mg—In.

With the foregoing method, it is possible to obtain a device structure 9 in which the substrate 2, the anode layer 3, the wiring pads 4, the insulation layer 5, the organic layer 6 and the cathode layer 7 are deposited. Further, the portions of the organic layer 6 exposed to the anode layer 3 through the openings of the insulation layer 5 become the luminous segments of the alphanumeric characters and the predetermined patterns.

After forming the device structure 9 on the substrate 2, the device structure 9 is sealed with a sealing member (not shown) made of, e.g., glass, metal or resin, in a glove box having a dry atmosphere of, e.g., Ar, He or $N_2$ gas. To be more specific, the sealing member is attached on the periphery of the substrate 2 by using, e.g., an epoxy based adhesive to form a hermetic seal, completing the organic EL device 1.

In the organic EL device 1 described above, the anode layer 3 and the wiring pads are formed on the portions of the substrate 2 wherein the wiring pads do not overlap with the luminous segments; and the insulation layer 5 is formed on the anode layer 3 and the wiring pads in such a way that the portions of the anode layer 3 corresponding to the luminous segments and the central portions of the wiring pads are exposed through the openings of the insulation layer 5. The cathode layer 7 is formed on the organic layer 6 by using the deposition mask 8 having the bridges 8b at the locations corresponding to the exposed wiring pads.

In doing so, the cathodes 7Aa–7Ad, 7Ba–7Bc, 7Ca–7Cc are electrically connected to each other within each of the cathode groups 7A, 7B and 7C, respectively, through the corresponding wiring pads. Even though the cathode layer 7 is not formed at the locations corresponding to the bridges 8b, the cathodes within each of the cathode groups 7A, 7B, 7C can be electrically connected to each other in their corresponding group since the bridges 8b only partially cover the exposed wiring pads around the center thereof as shown in FIG. 4.

Specifically, as shown in FIGS. 3A–3D, the cathodes 7Aa–7Ad of the upper cathode group 7A are commonly connected to each other through the pads 4Aa–4Ac; the cathodes 7Ba–7Bc of the middle cathode group 7B are commonly connected to each other through the pads 4Ba and 4Bb; and the cathodes 7Ca–7Cc of the lower cathode group 7C are commonly connected to each other through the pads 4Ca and 4Cb.

In such an organic EL device, the cathode layer or the second electrode layer can be readily formed on the organic layer by evaporation through the use of the mask. The inventive deposition mask having the bridges during the deposition process of the cathode layer is prevented from being bent or deformed. Thus, it becomes possible to prevent the electrical insulation failure to thereby eliminate or reduce the degradation problem of the display quality that occurs frequently due to the organic layer being damaged when using a prior art deposition mask.

Figure 6A:
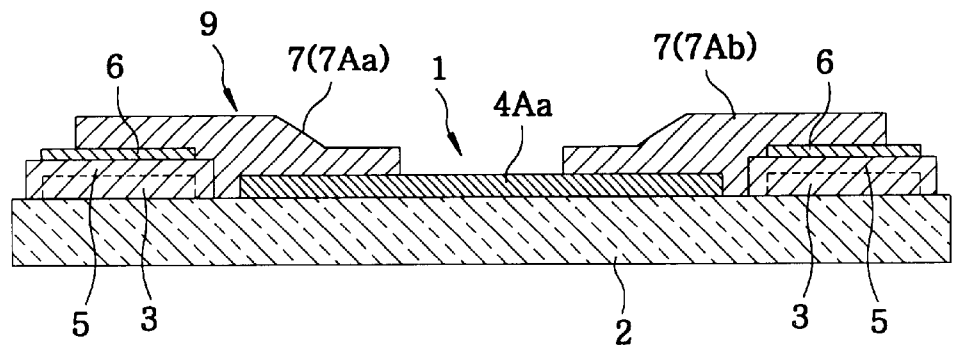
FIGS. 6A and 6B depict cross sectional views of region "A" in accordance with a second and a third preferred embodiments of the present invention.
Figure 6B:
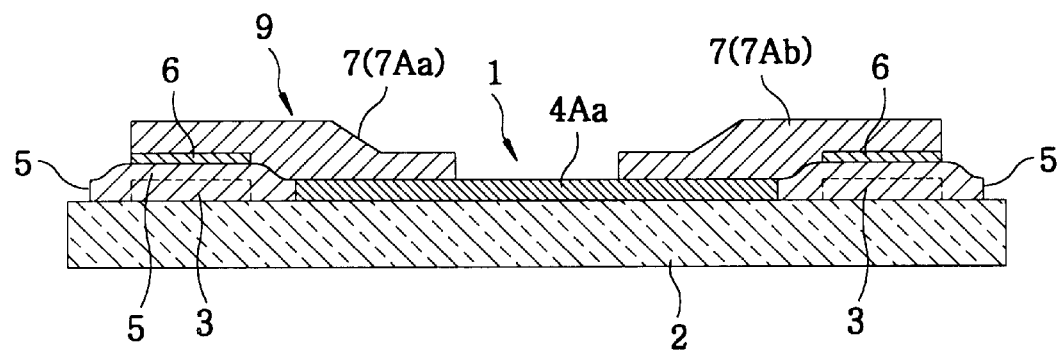

Although the above preferred embodiment of the present invention has been described with reference to the insulation layer 5 covering the periphery of the wiring pads, e.g., 4Aa as shown in FIG. 4, the insulation layer 5 may be formed to have different structures as shown in FIGS. 6A and 6B. It should be noted that like parts appearing in FIGS. 4, 6A and 6B are represented by like reference numerals.

Referring to FIGS. 6A and 6B, there are shown schematic cross sectional views of organic EL devices 1 in accordance with a second and a third preferred embodiment of the present invention.

Referring to FIG. 6A, the insulation layer 5 covering the anode layer 3 is formed not to overlap with the wiring pads, e.g., 4Aa and is spaced apart therefrom by a predetermined distance; and hence the wiring pads are entirely exposed without being covered by the insulation layer 5.

Referring to FIG. 6B, the insulation layer 5 covering the anode layer 3 extends to the edges of the wiring pads, e.g., 4Aa so as to be flush therewith while exposing the whole surface thereof.

Although the present invention has been described referring to the first and the second electrode layers as the anode and the cathode layer, respectively, it is to be understood that the first and the second electrode layers may be used as the cathode and the anode layer, respectively. In this case, the anode layer is divided into a plurality of anode groups, each anode group including a number of anodes and the anodes within each group being commonly connected to each other by the wiring pads.

The inventive organic EL device may also be used for displaying any kinds of characters, patterns and/or symbols including English characters.

While the invention has been shown and described with respect to the preferred embodiments, it will be understood by those skilled in the art that various changes and modifications may be made without departing from the spirit and scope of the invention as defined in the following claims.

What is claimed is:

1. An organic electroluminescent device comprising:

an insulating substrate;

a first electrode layer, a number of conductive wiring pads formed on the insulating substrate;

an organic layer formed on the first electrode layer; and a second electrode layer formed on the organic layer, wherein at least one of the electrode layers is transparent and the second electrode layer includes a plurality of disjointed electrodes, the disjointed electrodes being grouped into a plural number of groups and at least one of the groups having at least two disjointed electrodes, and wherein the electrodes of each of said at least one of the groups are electrically connected to each other via one or more selected wiring pads.

2. The device of claim 1, further comprising an insulation layer for defining luminous regions of the device, the insulation layer being positioned between the first electrode layer and the organic layer.

3. The device of claim 2, wherein the insulation layer is formed of an organic material.

4. The device of claim 1, wherein the wiring pads and the first electrode layer are formed directly on the insulating substrate.

5. The device of claim 1, wherein the wiring pads are made of an identical material to that of the second electrode layer.

6. The device of claim 5, wherein the caring pads and the second electrode layer are made of a material selected from the group consisting of Al, Li, Na, Mg, Ca, and a compound thereof, and an alloy Mg—Ag, Al—Li, Mg—In.

7. The device of claim 1, wherein, the first electrode layer and the wiring pads are made of an identical material.

8. The device of claim 7, wherein when the first electrode and the wiring pads are made of a conductive material having a larger resistivity than that of a material constituting the second electrode layer.

9. The device of claim 8, wherein the first electrode layer and the wiring pads are formed by using a transparent conductive film having ITO or ZnO, or an amorphous transparent conductive film and the second electrode layer is made of a material selected from the group consisting of Al, Li. Na, Mg, Ca, and a compound thereof, and an alloy Mg—Ag, Al—Li, Mg—In.

10. The device of claim 1, wherein the insulating substrate is made of a transparent material.

11. The device of claim 10, wherein the transparent material is glass.

12. The device of claim 2, wherein the organic layer and the insulation layer have openings to expose at least a portion of each of said one or more selected wiring pads and said electrodes of each of said at least one of the groups are electrically connected to each other via the exposed portion.

13. The device of claim 1, further comprising an insulation layer for defining luminous regions of the device, the insulation layer being positioned between the organic layer and the second electrode layer.

14. The device of claim 13, wherein the organic layer and the insulation layer have openings to expose at leas a portion of each of said one or more selected wiring pads and said electrodes of each of said at Yeast one of the groups are electrically connected to each other via the exposed potion.

* * * * *